United States Patent
Wavering et al.

(10) Patent No.: US 9,036,355 B2
(45) Date of Patent: May 19, 2015

(54) PRINTED WIRING BOARD (PWB) FOR HIGH AMPERAGE CIRCUITS

(75) Inventors: Jeffrey T. Wavering, Rockford, IL (US); Rainer J. Seidel, Tussenhausen (DE); Norbert J. Simper, Bissingen (DE); Josef Maier, Munningen (DE); Carl A. Wagner, Beloit, WI (US); Michael Krenz, Roscoe, IL (US); Michael William Foster, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 285 days.

(21) Appl. No.: 13/433,388

(22) Filed: Mar. 29, 2012

(65) Prior Publication Data

US 2013/0258626 A1  Oct. 3, 2013

(51) Int. Cl.
| | |
|---|---|
| H05K 1/00 | (2006.01) |
| H05K 1/18 | (2006.01) |
| H05K 7/00 | (2006.01) |
| H01R 9/00 | (2006.01) |
| H05K 1/02 | (2006.01) |

(52) U.S. Cl.
CPC .... H05K 1/0265 (2013.01); *H05K 2201/10272* (2013.01)

(58) Field of Classification Search
None
See application file for complete search history.

(56) References Cited

U.S. PATENT DOCUMENTS

| | | | | |
|---|---|---|---|---|
| 4,845,592 | A | * | 7/1989 | Himes et al. .................. 361/775 |
| 4,995,818 | A | * | 2/1991 | Saimoto .......................... 439/74 |
| 5,053,920 | A | * | 10/1991 | Staffiere et al. ............... 361/694 |
| 5,764,487 | A | * | 6/1998 | Natsume ....................... 361/775 |
| 5,822,189 | A | * | 10/1998 | Isshiki .......................... 361/736 |
| 5,858,557 | A | * | 1/1999 | Yoon et al. .................... 428/672 |
| 5,949,648 | A | * | 9/1999 | Liao .............................. 361/700 |
| 6,000,952 | A | * | 12/1999 | Gladd et al. ................. 439/76.2 |
| 6,036,508 | A | | 3/2000 | Anderson et al. |
| 6,437,986 | B1 | * | 8/2002 | Koshiba ........................ 361/752 |
| 6,518,090 | B2 | * | 2/2003 | Dotta et al. ................... 438/106 |
| 6,535,396 | B1 | | 3/2003 | Degenkolb et al. |
| 6,542,373 | B1 | * | 4/2003 | Oba .............................. 361/760 |
| 6,984,134 | B1 | | 1/2006 | Eakins et al. |
| 7,106,588 | B2 | | 9/2006 | Oberlin et al. |
| 7,193,850 | B2 | | 3/2007 | Pal |
| 7,215,555 | B2 | * | 5/2007 | Takagi .......................... 361/775 |
| 7,227,758 | B2 | * | 6/2007 | Brandenburg et al. ....... 361/780 |
| 7,292,011 | B2 | | 11/2007 | Beneditz |
| 7,518,882 | B2 | * | 4/2009 | Shimizu et al. ............... 361/775 |
| 7,532,483 | B2 | * | 5/2009 | Englekirk ..................... 361/767 |

(Continued)

OTHER PUBLICATIONS

Extended European Search Report for EP Application No. 13161527.0-1806, dated Nov. 14, 2014, pp. 1-6.

*Primary Examiner* — Hoa C Nguyen
*Assistant Examiner* — Xanthia C Cunningham
(74) *Attorney, Agent, or Firm* — Cantor Colburn LLP

(57) ABSTRACT

A printed wiring board (PWB) includes a substrate having first and second opposing surfaces and a busbar coupled to the substrate. The busbar includes a power input connector and a cross-sectional dimension configured and disposed to carry at least 100 amperes. At least one semiconductor device is mounted to the busbar. The at least one semiconductor device includes an input electrically coupled to the busbar and an output. One or more output conductors are electrically coupled to the output of the at least one semiconductor device. The one or more output conductors include a cross-sectional dimension configured and disposed to carry at least 50 amperes.

20 Claims, 2 Drawing Sheets

(56) References Cited

U.S. PATENT DOCUMENTS

| | | |
|---|---|---|
| 7,921,729 B2 | 4/2011 | Conner et al. |
| 8,031,486 B2 | 10/2011 | Wavering et al. |
| 8,223,506 B2* | 7/2012 | Lee ............... 361/775 |
| 8,284,563 B2* | 10/2012 | Hosokawa et al. ........... 361/775 |
| 8,339,801 B2* | 12/2012 | Tominaga et al. ............ 361/775 |
| 2001/0049211 A1* | 12/2001 | Sumida et al. .............. 439/76.2 |
| 2002/0167828 A1* | 11/2002 | Parkhill et al. ................ 363/144 |
| 2003/0063451 A1* | 4/2003 | Fujii et al. .................... 361/785 |
| 2006/0082983 A1* | 4/2006 | Parkhill et al. ................ 361/775 |
| 2006/0126316 A1* | 6/2006 | Takagi et al. ................ 361/775 |
| 2006/0138633 A1* | 6/2006 | Naruse et al. ................. 257/688 |
| 2006/0289664 A1* | 12/2006 | Tomikawa et al. ....... 237/12.3 R |
| 2007/0241858 A1* | 10/2007 | Bessho et al. ................. 337/283 |
| 2008/0054422 A1* | 3/2008 | Koike et al. ................... 257/676 |
| 2008/0099906 A1* | 5/2008 | Yamasaki et al. ............. 257/691 |
| 2009/0002956 A1* | 1/2009 | Suwa et al. ................... 361/728 |
| 2009/0111294 A1 | 4/2009 | Barry et al. |
| 2009/0152955 A1 | 6/2009 | Chan et al. |
| 2009/0231810 A1* | 9/2009 | Liang et al. ................... 361/699 |
| 2009/0231811 A1* | 9/2009 | Tokuyama et al. ........... 361/699 |
| 2009/0309220 A1* | 12/2009 | Katogi et al. ................. 257/741 |
| 2010/0148298 A1* | 6/2010 | Takano et al. ................ 257/500 |

* cited by examiner

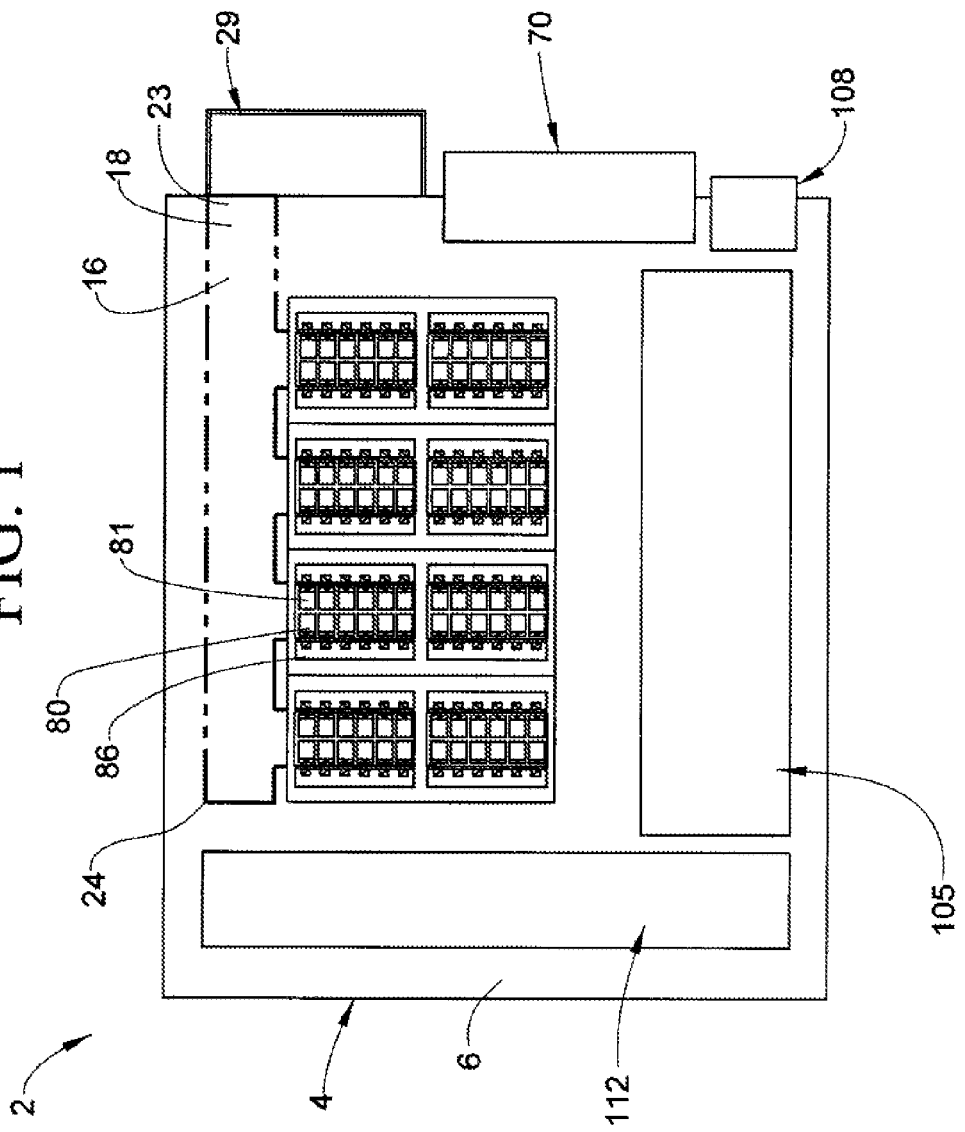

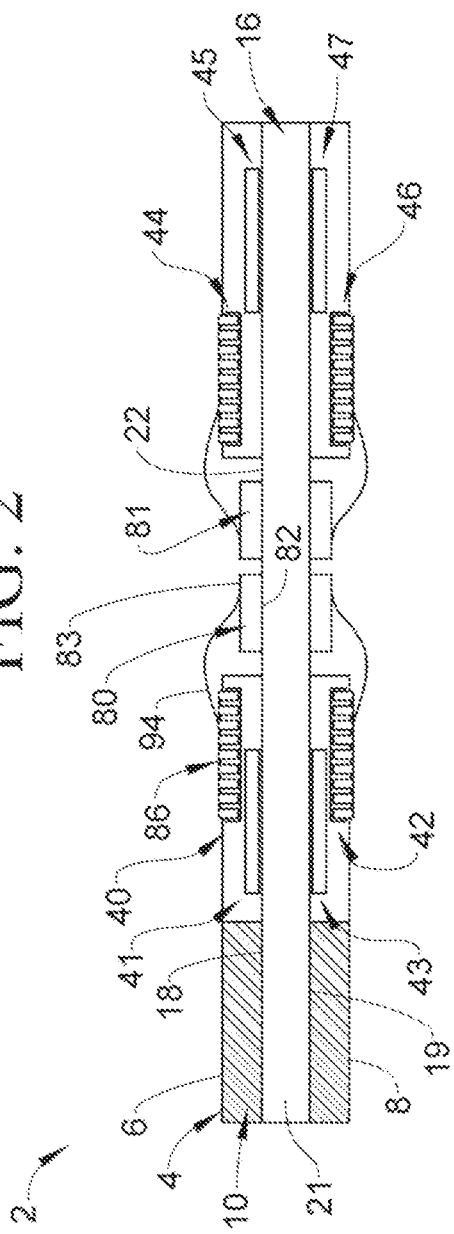

PRINTED WIRING BOARD (PWB) FOR HIGH AMPERAGE CIRCUITS

BACKGROUND OF THE INVENTION

Exemplary embodiments pertain to the art of electrical power distribution systems and, more particularly, to a printed wiring board that provides an interface between a high amperage bus and high amperage circuits.

Electrical circuits that carry high amperage, that is amperage at or over about 20 amps, typically employ contactors, circuit breakers, and the like to control current flow. The contactors and circuit breakers are connected together and to busbars using large metal rails, large gauge wire, bolts, nuts, and other assembly components. Similar components are employed in primary electric power distribution systems for aircraft. That is, many aircraft include large electrical distribution systems that employ contactors, circuit breakers, and the like to distribute power between a large bus to various electrical subsystems.

BRIEF DESCRIPTION OF THE INVENTION

Disclosed is a printed wiring board (PWB) including a substrate having first and second opposing surfaces and a busbar coupled to the substrate. The busbar includes a power input connector and a cross-sectional dimension configured and disposed to carry at least 100 amperes. At least one semiconductor device is mounted to the busbar. The at least one semiconductor device includes an input electrically coupled to the busbar and an output. One or more output conductors are electrically coupled to the output of the at least one semiconductor device. The one or more output conductors include a cross-sectional dimension configured and disposed to carry at least 50 amperes.

BRIEF DESCRIPTION OF THE DRAWINGS

The following descriptions should not be considered limiting in any way. With reference to the accompanying drawings, like elements are numbered alike:

FIG. 1 is a plan view of a printed wiring board (PWB) in accordance with an exemplary embodiment;

FIG. 2 is a cross-sectional view of the PWB of FIG. 1; and

FIG. 3 is a cross-sectional view of an output conductor and semiconductor device of the PWB of FIG. 1.

DETAILED DESCRIPTION OF THE INVENTION

A detailed description of one or more embodiments of the disclosed apparatus and method are presented herein by way of exemplification and not limitation with reference to the Figures.

A printed wiring board (PWB) in accordance with an exemplary embodiment is indicated generally at 2 in FIGS. 1-2. PWB 2 includes a substrate 4 having first and second opposing surfaces 6 and 8 that define an intermediate zone 10. PWB is also shown to include a busbar 16 extending through intermediate zone 10 and being bonded to substrate 4. Busbar 16 includes a first surface portion 18 and an opposing second surface portion 19 that defines a cross-sectional dimension 21. First and second surface portions 18 and 19 are provided with a Nickel-Gold (Ni—Au) coating 22 to enhance conductivity.

Busbar 16 includes a first end 23 that extends to a second end 24. First end 23 defines an input that is coupled to a power input connector 29. In accordance with an exemplary embodiment, busbar 16 is formed from aluminum and cross-sectional dimension 21 defines a rectangle having a width or thickness parameter of between about 1 mm and about 6 mm. In accordance with another aspect of the exemplary embodiment, cross-sectional dimension 21 defines a rectangle having a width or thickness parameter of between about 2 mm and about 5 mm. In accordance with yet another aspect of the exemplary embodiment, cross-sectional dimension 21 defines a rectangle having a width or thickness parameter of about 4 mm. With this arrangement, busbar 16 is configured to conduct up to about 100 amps or more. The particular width parameters of cross-sectional dimension 21 provide various electrical attributes to busbar 16 such as resistance. The particular width parameters of cross-sectional dimension 21 also provide a degree of flexibility in current carrying capacity that allows busbar 16 to absorb spikes in electrical current without being damaged.

In further accordance with the exemplary embodiment, PWB 2 includes a plurality of output conductors 40-47 embedded within substrate 4. Output conductors 40, 44 are positioned adjacent first surface 6 and output conductors 42 and 46 are positioned adjacent to second surfaces 8. In contrast, output conductors 41 and 45 are arranged between output conductors 42 and 46 and first surface portion 18 of busbar 16. Output conductors 43 and 47 are positioned between output conductors 42 and 46 and second surface portion 19 of busbar 16. Of course it should be understood that the number and particular arrangement of output conductors 40-47 may vary. As each output conductor 40-47 is substantially similar, a detailed description will follow with reference to FIG. 3 in describing output conductor 40 with an understanding that output conductors 41-47 include corresponding structure.

Output conductor 40 is formed from copper and includes a first surface section 60 and an opposing second surface section 61 that defines a cross-sectional dimension 63. In accordance with one aspect of the exemplary embodiment, cross-sectional dimension 63 defines a rectangle having a width or thickness parameter of between about 0.25 mm and about 1 mm. In accordance with another aspect of the exemplary embodiment, cross-sectional dimension 63 defines a rectangle having a width or thickness parameter of about 0.5 mm. With this arrangement, output conductor 40 is configured to conduct up to about 50 amps or more. The particular width parameters of cross-sectional dimension 63 provide various electrical attributes to output conductor 40 such as providing a desired resistance. The particular width parameters of cross-sectional dimension 63 also provide a degree of flexibility in current carrying capacity that allows output conductor 40 to absorb spikes in electrical current without being damaged. Each of the plurality of output conductors 40-47 is electrically connected to an output connector 70 supported on substrate 4. Output connector 70 provides an interface with various output devices or electrical loads (not shown).

In further accordance with the exemplary embodiment, PWB 2 includes a plurality of semiconductor devices, two of which are shown at 80 and 81, that provide a switchable connection between busbar 16 and output conductors 40-47. As each semiconductor device 80, 81 is substantially similar, a detailed description will follow with reference to FIG. 3 in describing semiconductor 80 with an understanding that semiconductor 81 includes corresponding structure. Semiconductor 80 includes an input 82 and an output 83. Input 82 is electrically connected to busbar 16. More specifically, semiconductor device 80 is soldered to first surface portion 18 of busbar 16. In the exemplary embodiment shown, output 83 is electrically coupled to output conductor 40. More specifically, output 83 is electrically coupled to output conductor 40 through a connector conductor or trace 86 provided on first surface 6 of substrate 4. Connector conductor 86 is electrically coupled to output conductor 40 through a plurality of vias 90 that extend from first surface 6 of substrate 4 to first surface section 60 of output conductor 40. Vias 90 are filled with a conducting metal (not separately labeled) that establishes an electrical bond between connector conductor 86 and output conductor 40. A bond wire 94 electrically links output 83 with connector conductor 86. In accordance with the exemplary aspect shown, connector conductor 86 is formed from copper and has a length and a width (not separately labeled) that establish a rectangular cross-section (also not separately labeled) having a thickness parameter of between about 0.035 mm and about 0.1 mm.

In still further accordance with the exemplary embodiment, PWB 2 includes a controller 105 supported upon substrate 4 and connected to semiconductor devices 80, 81. Controller 105 is also connected to an interface connector 108. Interface connector 108 provides signals to controller 105 to selectively control or bias semiconductors 80, 81. Controller 105 is also shown to be connected to a power supply 112. Power supply 112 provides any necessary low voltage power to controller 105 and semiconductors 80, 81. At this point it should be understood that the present invention provides a system for providing switchable electrical current between an electrical input and one or more electrical loads. The PWB in accordance with the exemplary embodiment provides a switchable interface for high current operations without requiring bulky contactors, relays and the like. As such, the PWB in accordance with the exemplary embodiment may be advantageously incorporated into, for example, an aircraft electrical system. By eliminating the need for costly and bulky contactors/relays, the PWB in accordance with the present invention not only provides a desirable weight and cost reduction over prior art systems, but also simplifies changing components. That is, instead of the time required to diagnose and replace a faulty contactor or relay, a service technician may simply unplug and replace the PWB.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A printed wiring board (PWB) comprising:
a substrate having first and second opposing surfaces;
a busbar extending through the substrate between the first and second opposing surfaces, the busbar including a power input connector and a cross-sectional dimension configured and disposed to carry at least 100 amperes;
at least one semiconductor device mounted to the busbar at the first surface, the at least one semiconductor device including an input electrically coupled to the busbar and an output;
another at least one semiconductor device mounted to the busbar at the second surface, the another at least one semiconducting including an input electrically coupled to the busbar and an output; and
one or more output conductors electrically coupled to output of the at least one semiconductor device and the another at least one semiconductor device, the one or more output conductors including a cross-sectional dimension configured and disposed to carry at least 50 amperes.

2. The PWB according to claim 1, wherein the cross-sectional dimension of the busbar includes a width and a length so as to define a rectangle.

3. The PWB according to claim 2, wherein the width of the cross-sectional dimension of the busbar is between about 1 mm and about 6 mm.

4. The PWB according to claim 3, wherein the width of the cross-sectional dimension of the busbar is between about 2 mm and about 5 mm.

5. The PWB according to claim 4, wherein the width of the cross-sectional dimension of the busbar is about 4 mm.

6. The PWB according to claim 1, wherein the cross-sectional dimension of the one or more output conductors includes a width and a length so as to define a rectangle.

7. The PWB according to claim 6, wherein the width of the cross-sectional dimension of the one or more output conductors is between about 0.25 mm and about 1.0 mm.

8. The PWB according to claim 7, wherein the width of the cross-sectional dimension of the one or more output conductors is about 0.5 mm.

9. The PWB according to claim 1, further comprising: a controller mounted to the substrate, the controller being configured and disposed to selectively activate the at least one semiconductor device to establish an electrical circuit between the busbar and the one or more output conductors.

10. The PWB according to claim 9, further comprising: a power supply operatively connected to the controller.

11. The PWB according to claim 1, further comprising: a Nickel-Gold plating provided on each of the first and second opposing surfaces of the substrate.

12. The PWB according to claim 1, further comprising: an output connector mounted to the substrate and electrically connected to the one or more output conductors.

13. The PWB according to claim 1, further comprising: an input connector mounted to the substrate and electrically connected to the busbar.

14. The PWB according to claim 1, wherein the first and second opposing surfaces are spaced one from the other so as to define an intermediate zone, the busbar extending through the intermediate zone.

15. The PWB according to claim 1, wherein the busbar is formed from aluminum.

16. The PWB according to claim 1, wherein the one or more output conductors is formed from copper.

17. The PWB according to claim 1, further comprising: one or more connector conductors formed in the substrate, the one or more connector conductors being electrically bonded to the one or more output conductors.

18. The PWB according to claim 17, further comprising: a bond wire electrically connecting the output of the at least one semiconductor device and at least one of the one or more connector conductors.

19. The PWB according to claim 17, wherein the one or more connector conductors includes a width and a length so as to define a rectangle, the width being between about 0.035 mm and about 0.1 mm.

20. The PWB according to claim 1, wherein the at least one semiconductor is joined to the busbar through a soldered joint.

* * * * *